(12) United States Patent
Huang

(10) Patent No.: US 8,267,660 B2
(45) Date of Patent: Sep. 18, 2012

(54) FAN MODULE FOR DISSIPATING HEAT

(75) Inventor: Chao-Jui Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 367 days.

(21) Appl. No.: 12/644,004

(22) Filed: Dec. 21, 2009

(65) Prior Publication Data

US 2011/0064561 A1 Mar. 17, 2011

(51) Int. Cl.
*F01D 1/24* (2006.01)
*H05K 7/20* (2006.01)
(52) U.S. Cl. ......... 416/120; 416/123; 416/175; 361/695
(58) Field of Classification Search .................. 416/128, 416/130, 123, 120, 198 R, 213.1, 175, 62, 416/65, 60; 361/690, 694, 695; 415/213.1, 415/62, 65, 60

See application file for complete search history.

(56) References Cited

U.S. PATENT DOCUMENTS

| 6,817,831 | B2 * | 11/2004 | Stevens et al. ................. 415/61 |
| 7,054,155 | B1 * | 5/2006 | Mease et al. .................. 361/695 |
| 7,406,835 | B2 * | 8/2008 | Allen et al. ..................... 62/179 |
| 7,458,767 | B2 * | 12/2008 | Wu et al. ......................... 415/60 |
| 2002/0094282 | A1 * | 7/2002 | Bendikas et al. ............. 417/360 |

\* cited by examiner

*Primary Examiner* — Dwayne J White
(74) *Attorney, Agent, or Firm* — Altis Law Group, Inc.

(57) ABSTRACT

A fan module includes a framework and at least two blade assemblies arranged inside the framework. Each blade assembly includes at least two blade units arranged in line. The rotating direction of each blade assembly is opposite to that of adjacent blade assembly.

8 Claims, 2 Drawing Sheets

FAN MODULE FOR DISSIPATING HEAT

BACKGROUND

1. Technical Field

The present disclosure relates to heat dissipation technologies and, particularly, to a fan module for heat dissipation.

2. Description of Related Art

Many electronic devices such as central processing units (CPUs) generate a lot of heat. The heat must be efficiently removed from such devices to ensure normal operation of such devices. Generally, a plurality of fans is mounted to the electronic device to remove heat therefrom. However, in use, the fans vibrate and therefore can damage the electronic device.

Therefore, what is needed is a fan module which can overcome the limitations described above.

BRIEF DESCRIPTION OF THE DRAWINGS

The components of the drawings are not necessarily drawn to scale, the emphasis instead being placed upon clearly illustrating the principles of the embodiments of the fan module. Moreover, in the drawings, like reference numerals designate corresponding parts throughout several views.

DETAILED DESCRIPTION

Figure 1:
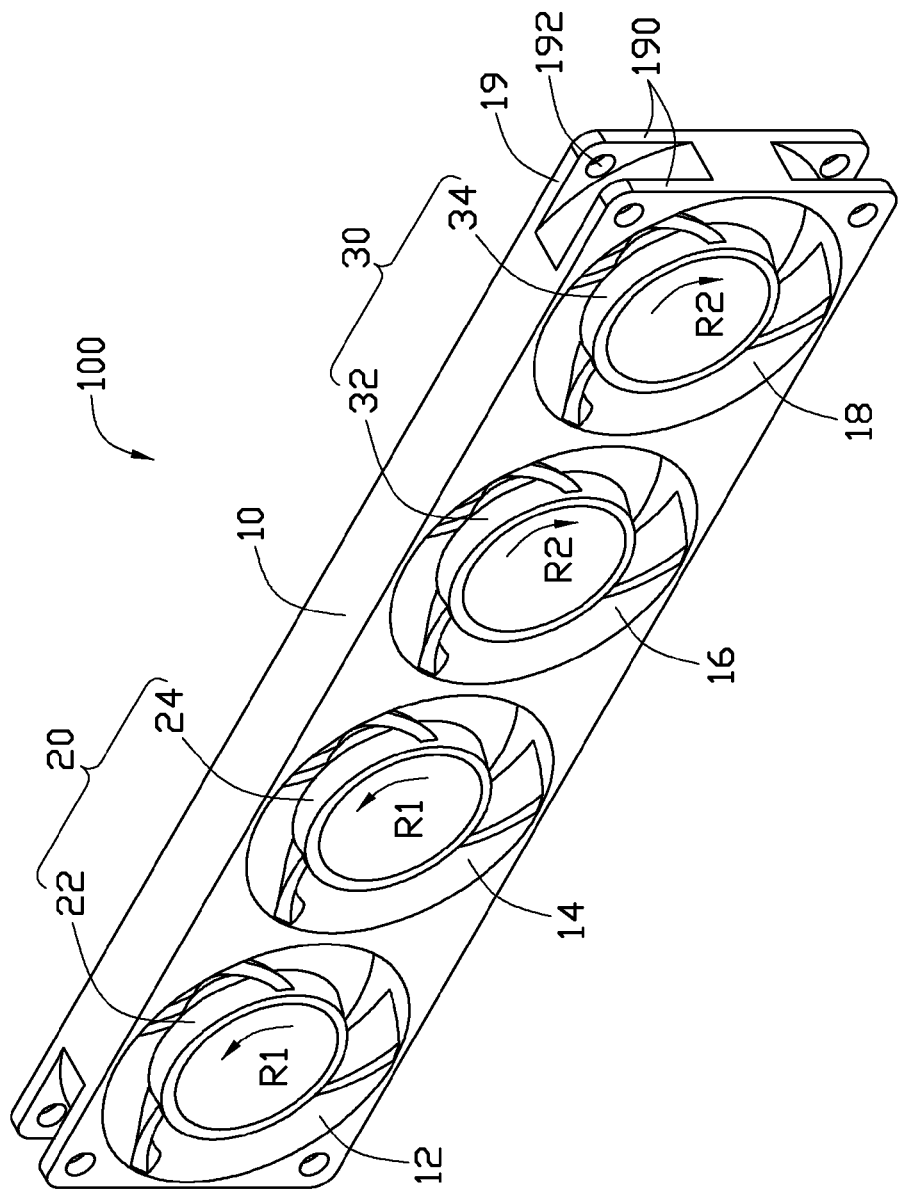
FIG. 1 is an isometric view of a fan module, according to a first exemplary embodiment.

Referring to FIG. 1, a fan module 100, according to a first exemplary embodiment, includes a framework 10, a first blade assembly 20, and a second blade assembly 30. The first blade assembly 20 and the second blade assembly 30 are arranged inside the framework 10.

The framework 10 is approximately cuboid. A first receiving hole 12, a second receiving hole 14, a third receiving hole 16, and a fourth receiving hole 18 are defined in the framework 10. The four receiving holes 12, 14, 16, 18 are spaced from each other and arranged in line. The framework 10 includes four fixing portions 19 at four corners thereof. Each fixing portion 19 includes two opposite plates 190. A through hole 192 is defined in each plate 190. Bolts (not shown) extend through the through holes 192 so that the framework 10 is fixed to an electronic device, such as host computer (not show).

The first blade assembly 20 includes a first blade unit 22 and a second blade unit 24. The first blade unit 22 is received in the first receiving hole 12. The second blade unit 24 is received in the second receiving hole 14. The second blade assembly 30 includes a third blade unit 32 and a fourth blade unit 34. The third blade unit 32 is received in the third receiving hole 16. The fourth blade unit 34 is received in the fourth receiving hole 18. The four blade units 22, 24, 32, 34 are also arranged in line. A rotating direction of the blade units 22, 24 of the first blade assembly 20 is opposite to that of the blade units 32, 34 of the second blade assembly 30. In this embodiment, the blade units 22, 24, 32, 34 are axial flow blade units. The first and second blade units 22, 24 rotate a first direction R1, and the third and fourth blade units 32, 34 rotate a second direction R2. The first direction R1 is contrary to the second direction R2. Therefore, vibration generated by the four blade units 22, 24, 32, 34 can be reduced by at least a portion of the vibration generated by the movement of blades in one direction being canceled out by the vibration generated by the movement of the blades in the contrary direction.

Figure 2:
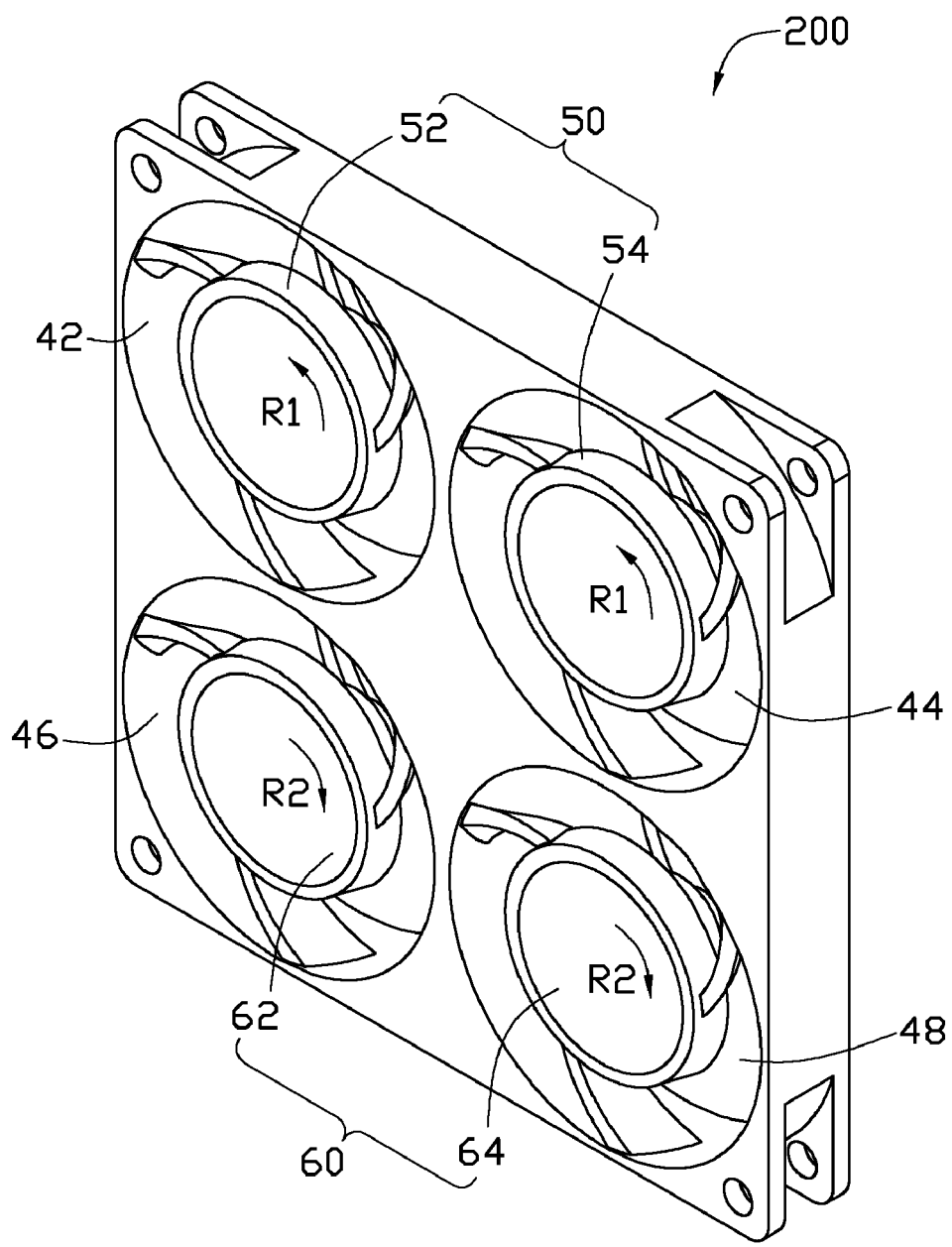
FIG. 2 is an isometric view of a fan module, according to a second exemplary embodiment.

Referring to FIG. 2, a fan module 200, according to a second exemplary embodiment is shown. Differences between the fan module 200 of this exemplary embodiment and the fan module 100 of the first exemplary embodiment are the following: the first and second receiving holes 42, 44 are arranged in line, and the third and fourth receiving holes 46, 48 are arranged in line parallel to the first and second receiving holes 42, 44. That is, the four receiving holes 42, 44, 46, 48 are arranged in a 2×2 array. As a result, the first and second blade units 52, 54 are arranged in line, and the third and fourth blade units 62, 64 are arranged in line, and the first blade assembly 50 is parallel to the second impeller 60.

Advantages of the fan module 200 of the second exemplary embodiment are similar to those of the fan module 100 of the first exemplary embodiment.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A fan module for dissipating heat, comprising:
    a framework defining at least four receiving holes, the at least four receiving holes spaced from each other; and
    at least two blade assemblies, wherein each blade assembly comprises at least two blade units, the at least two blade units are axial flow blade units, each blade unit is received in a corresponding receiving hole, the rotating direction of the at least two blade units of each blade assembly is contrary to that of the at least two blade units of adjacent blade assembly, and the at least two blade assemblies are arranged in a line.

2. The fan module as claimed in claim 1, wherein the framework is approximately cuboid and comprises four fixing portions, and each fixing portion comprises two opposite plates; a through hole is defined in each plate.

3. A fan module for dissipating heat, comprising:
    a framework defining a first receiving hole, a second receiving hole, a third receiving hole, and a fourth receiving hole, the four receiving holes spaced from each other and arranged in a straight line;
    a first blade assembly comprising a first blade unit and a second blade unit, the first blade unit received in the first receiving hole, the second blade unit received in the second receiving hole; and
    a second blade assembly comprising a third blade unit and a fourth blade unit, the third blade unit received in the third receiving hole, the fourth blade unit received in the fourth receiving hole, the rotating direction of the first blade assembly being contrary to that of the second blade assembly.

4. The fan module as claimed in claim 3, wherein the framework is approximately cuboid and comprises four fixing portions, and each fixing portion comprises two opposite plates; a through hole is defined in each plate.

5. The fan module as claimed in claim 3, wherein the first and second blade units are axial flow blade units.

6. A fan module for dissipating heat, comprising:
    a framework defining a first receiving hole, a second receiving hole, a third receiving hole, and a fourth receiving hole, the four receiving holes spaced from each other, the first and second receiving holes arranged in a first straight line, and the third and fourth receiving holes arranged in a second straight line parallel to the first straight line, the four receiving holes arranged in a 2×2 array;

a first blade assembly comprising a first blade unit and a second blade unit, the first blade unit received in the first receiving hole, the second blade unit received in the second receiving hole; and a second blade assembly comprising a third blade unit and a fourth blade unit, the third blade unit received in the third receiving hole, the fourth blade unit received in the fourth receiving hole, the rotating direction of the first blade assembly being contrary to that of the second blade assembly.

7. The fan module as claimed in claim 6, wherein the framework is approximately cuboid and comprises four fixing portions, and each fixing portion comprises two opposite plates; a through hole is defined in each plate.

8. The fan module as claimed in claim 6, wherein the first and second blade units are axial flow blade units.

* * * * *